(12) United States Patent
Guo

(10) Patent No.: US 10,928,879 B2
(45) Date of Patent: Feb. 23, 2021

(54) ARCHITECTURE FOR IMPROVING RELIABILITY OF MULT-SERVER SYSTEM

(71) Applicant: ZHENGZHOU YUNHAI INFORMATION TECHNOLOGY CO., LTD., Henan (CN)

(72) Inventor: Meng Guo, Henan (CN)

(73) Assignee: ZHENGZHOU YUNHAI INFORMATION TECHNOLOGY CO., LTD., Henan (CN)

( * ) Notice: Subject to any disclaimer, the term of this patent is extended or adjusted under 35 U.S.C. 154(b) by 124 days.

(21) Appl. No.: 16/097,125

(22) PCT Filed: Sep. 14, 2017

(86) PCT No.: PCT/CN2017/101723
§ 371 (c)(1),
(2) Date: Oct. 26, 2018

(87) PCT Pub. No.: WO2018/196259
PCT Pub. Date: Nov. 1, 2018

(65) Prior Publication Data
US 2019/0324515 A1      Oct. 24, 2019

(30) Foreign Application Priority Data

Apr. 28, 2017   (CN) .......................... 2017 1 0293823

(51) Int. Cl.
*G06F 1/30*      (2006.01)
*H05K 7/14*      (2006.01)

(52) U.S. Cl.
CPC ............. *G06F 1/30* (2013.01); *H05K 7/1492* (2013.01)

(58) Field of Classification Search
None
See application file for complete search history.

(56) References Cited

U.S. PATENT DOCUMENTS

| 7,386,666 B1* | 6/2008 | Beauchamp | ........ G06F 11/2094 711/114 |
| 2008/0162758 A1* | 7/2008 | Gideons | .............. G06F 13/4291 710/110 |

(Continued)

FOREIGN PATENT DOCUMENTS

| CN | 204925898 U | 12/2015 |
| CN | 106201758 A | 12/2016 |

(Continued)

OTHER PUBLICATIONS

International Search Report and Written Opinion from International Application No. PCT/CN2017/101723, dated Jan. 25, 2018.

*Primary Examiner* — Kim Huynh
*Assistant Examiner* — Kevin M Stewart
(74) *Attorney, Agent, or Firm* — Yue (Robert) Xu; Apex Attorneys at Law, LLP

(57) ABSTRACT

An architecture for improving reliability of a multi-server system is provided. The hard disk backplane is provided with at least two hard disk modules, each of which includes a power supply isolation unit and a signal isolation unit. The power connection board is connected to the power supply isolation unit in each of the at least two hard disk modules, so that power supplies of the at least two hard disk module are isolated from each other. Each of the at least two server nodes is connected to at least one of the hard disks through a corresponding signal isolation unit. The server node, the signal isolation unit and the hard disk which are connected to each other form an isolated data communication group. Signal isolation units in any two of isolated data communication groups belong to different hard disk modules.

5 Claims, 3 Drawing Sheets

(56) References Cited

U.S. PATENT DOCUMENTS

2015/0145329 A1* 5/2015 Okashita ................. H02J 9/061
　　　　　　　　　　　　　　　　　　　　　　　　　307/23
2015/0364908 A1* 12/2015 Odaohhara ............ H02H 9/001
　　　　　　　　　　　　　　　　　　　　　　　　　361/93.8

FOREIGN PATENT DOCUMENTS

| CN | 106502364 A | 3/2017 |
| CN | 107102917 A | 8/2017 |

* cited by examiner

ARCHITECTURE FOR IMPROVING RELIABILITY OF MULT-SERVER SYSTEM

This application is the national phase of International Application No. PCT/CN2017/101723, titled "ARCHITECTURE FOR IMPROVING RELIABILITY OF MULT-SERVER SYSTEM", filed on Sep. 14, 2017, which claims the priority to Chinese Patent Application No. 201710293823.1, titled "ARCHITECTURE FOR IMPROVING RELIABILITY OF MULT-SERVER SYSTEM", filed on Apr. 28, 2017 with the Chinese Patent Office, which are incorporated herein by reference in their entireties.

FIELD

The present disclosure relates to the field of servers, and in particular to an architecture for improving reliability of a multi-server system.

BACKGROUND

With the development of the internet industry, demands for storage capacities of data centers have increased, and more energy-efficient and cost-effective servers with higher density are constantly emerging. In order to save cost, operators make full use of existing computer room space, and improve the data processing ability of the server system that occupy a limited space as much as possible to meet the needs of data processing.

Multi-server systems are proposed to serve the needs of data processing of customers, in which multiple servers are arranged in a limited space to effectively improve the space utilization of the computer room. When the system is running, multiple servers are connected to the same hard disk backplane and the storage functions of the multiple servers are realized through the hard disk backplane. A failure in a line associated with a server node on the hard disk backplane will lead to the failure of the whole hard disk backplane, which leads to the storage failure of the whole server system and effects the operation of the server system.

SUMMARY

In order to overcome the shortcomings of the above existing technology, an architecture for improving reliability of a multi-server system is provided in the present disclosure. The architecture includes a hard disk backplane, at least two server nodes, a power connection board and at least two hard disks.

The hard disk backplane is provided with at least two hard disk modules, each of which includes a power supply isolation unit and a signal isolation unit.

The power connection board is connected to the power supply isolation unit in each of the at least two hard disk modules, so that power supplies of the at least two hard disk module are isolated from each other.

Each of the at least two server nodes is connected to at least one of the hard disks through a corresponding signal isolation unit, the server node, the signal isolation unit and the hard disk which are connected to each other form an isolated data communication group, signal isolation units in any two of isolated data communication groups belong to different hard disk modules, so that any two of the isolated data communication groups are isolated from each other.

Preferably, each of the at least two hard disk modules further includes a CPLD module of a complex programmable logic controller. The CPLD module is configured to edit and set hard disk jumpers, set a hard disk active state, monitor a hard disk failure, detect a hard disk working state and control working of a hard disk lamp.

Preferably, the signal isolation unit includes a first MOS transistor and an enable control circuit.

A first server node is connected to a drain D the first MOS transistor, a first hard disk is connected to a source S of the first MOS transistor, and the enable control circuit is connected to a gate G of the first MOS transistor.

A single-ended signal is inputted from the first server node to the drain D of the first MOS transistor, and a single-ended signal is outputted from the source S the first MOS transistor to the first hard disk.

The first server node, the first hard disk and the signal isolation unit belong to a same isolated data communication group.

Preferably, the power supply isolation unit includes a first resistor R1, a second resistor R2, a third resistor R3, a fourth resistor R4, a fifth resistor R5, a sixth resistor R6, a seventh resistor R7, an eighth resistor R8, a ninth resistor R9, a tenth resistor R10, an eleventh resistor R11, a twelfth resistor R12, a first capacitor C1, a second capacitor C2, a third capacitor C3, a fourth capacitor C4, a fifth capacitor C5, a first diode D1, a second diode D2, a third diode D3, a fourth diode D4, a first triode Q1, a second triode Q2, a third triode Q3, a fourth triode Q4, a first field effect transistor QD1, a second field effect transistor QD2, and an amplifier LM.

A first terminal of the first resistor R1 is connected to an input terminal of the power supply isolation unit, and the input terminal of the power supply isolation unit is connected to the power connection board.

A second terminal of the first resistor R1 is grounded through the first capacitor C1 and is connected to a first terminal of the second resistor R2. A second terminal of the second resistor R2 is connected to a gate G of the first field effect transistor QD1, a gate G of the second field effect transistor QD2 and a pin 3 of the amplifier LM. A positive pole of an external power supply is connected to an anode of the first diode D1, a first terminal of the fifth resistor R5 and a first terminal of the sixth resistor R6, and is grounded through the second capacitor C2. A cathode of the first diode D1 is connected to a base of the first triode Q1 through the fourth resistor R4 and is connected to a first terminal of the third resistor R3. A second terminal of the fifth resistor R5 is connected to an emitter of the first triode Q1. A second terminal of the sixth resistor R6 is connected to a collector of the second triode Q2. A second terminal of the third resistor R3 is connected to a first terminal of the seventh resistor R7 and an anode of the second diode D2. A second terminal of the seventh resistor R7 is connected to a base of the third triode Q3. A cathode of the second diode D2 is grounded through the fifth capacitor C5 and is connected to a second terminal of the eighth resistor R8, a second terminal of the resistor R9 and a negative pole of the external power supply. A first terminal of the eighth resistor R8 is connected to an emitter of the third triode Q3. A first terminal of the ninth resistor R9 is connected to a collector of the fourth triode Q4. A collector of the first triode Q1 is connected to a base of the second triode Q2, a first terminal of the third capacitor C3 and a cathode of the third diode D3. A second terminal of the third capacitor C3 and an anode of the third diode D3 are connected to a drain D of the first field effect transistor QD1. A source S of the first field effect transistor QD1 is connected to a pin 1 and a pin 2 of the amplifier LM, is connected to an output terminal of the power supply isolation unit through the twelfth resistor R12, and is connected to a source S of the second field effect transistor QD2 through the eleventh resistor R11. The pin 1 of the amplifier LM is connected to a pin 5 of the amplifier LM through the tenth resistor R10. An emitter of the second triode Q2 is connected to the source S of the second field effect transistor QD2, the eleventh resistor R11, a pin 7 of the amplifier LM and a sliding terminal of the tenth resistor R10. A drain D of the second field effect transistor QD2 is connected to a first terminal of the fourth capacitor C4 and a cathode of the fourth diode D4. A second terminal of the fourth capacitor C4, an anode of the fourth diode D4, a collector of the third triode Q3 and a base of the fourth triode Q4 are connected. An emitter of the fourth triode Q4 is connected to a pin 4 of the amplifier LM, the source S of the first field effect transistor QD1 and the eleventh resistor R11.

Preferably, the hard disk module further includes a hot-plug assembly.

The hot-plug assembly includes a hot-plug buffer and a hot-plug control IC.

The hot-plug control IC is connected to the hot-plug buffer, and the hot-plug buffer is provided with an I2C signal input terminal and an I2C signal output terminal.

The hot-plug control IC is configured to send an Enable signal to make the hot-plug buffer work when the hot-plug control IC detects a Ready signal which indicates that a handshake between a hot-plug I2C signal of the hard disk module and an I2C signal of another card is finished.

Preferably, the power supply isolation unit includes a sampling resistor, a second MOS transistor and a microcontroller.

A first terminal of the sampling resistor is connected to the power connection board, a second terminal of the sampling resistor is connected to a drain D of the second MOS transistor, and a drain D a source S of the second MOS transistor is connected to an output terminal of the power supply isolation unit.

The microcontroller is connected to the server node, the sampling resistor and a gate G of the second MOS transistor.

The microcontroller is configured to obtain a power supply current through the sampling resistor, and control on/off of the second MOS transistor by being connected to the gate G of the second MOS transistor. The microcontroller controls the second MOS transistor to be turned off in a case that the power supply current is greater than a preset value. Alternatively, the microcontroller exchanges data with the server node, transmits the obtained power supply current to the server node, and controls on/off of the second MOS transistor according to a control instruction of the server node.

According to the above technical solutions, it can be seen that the present disclosure has the following advantages.

In the architecture for improving reliability of a multi-server system, the hard disk backplane is provided with multiple hard disk modules. The number of the hard disk modules corresponds to the number of server nodes, and the hard disk modules includes signal isolation units, where each server node corresponds to one of the hard disk modules, such that reliability of signal transmission is improved. Hard disk power supply lines, signal lines and management lines are separately arranged, thereby avoiding a system failure due to a failure in a line of a hard disk controlled by a single server node, such that the reliability of the hard disk backplane can be improved.

The hot plug assembly is provided on the signal input terminal of the hard disk backplane, to realize hot plug of the signal of the hard disk backplane, and further prevent the damage to chips caused by positive and negative noise pulses of the signal during hot plug.

The power supply isolation unit is provided at the power supply input terminal of the hard disk backplane of the architecture for improving reliability of the multi-server system, to avoid power off the entire system.

BRIEF DESCRIPTION OF THE DRAWINGS

The drawings to be used in the description will be described briefly as follows, so that the technical solutions according to the embodiments of the present disclosure will become clearer. It is apparent that the drawings in the following description only illustrate some embodiments of the present application. For those skilled in the art, other drawings may be obtained according to these drawings without any creative work.

DETAILED DESCRIPTION

In order to make the purposes, features, and advantages of the present disclosure more obvious and understandable, technical solutions according to embodiments of the present disclosure are described clearly and completely hereinafter in conjunction with drawings and the embodiments of the present disclosure. Apparently, the described embodiments are only some embodiments of the present disclosure rather than all the embodiments. Any other embodiments obtained by those skilled in the art based on the embodiments of the present disclosure without any creative work fall in the scope of protection of the present disclosure.

Figure 1:
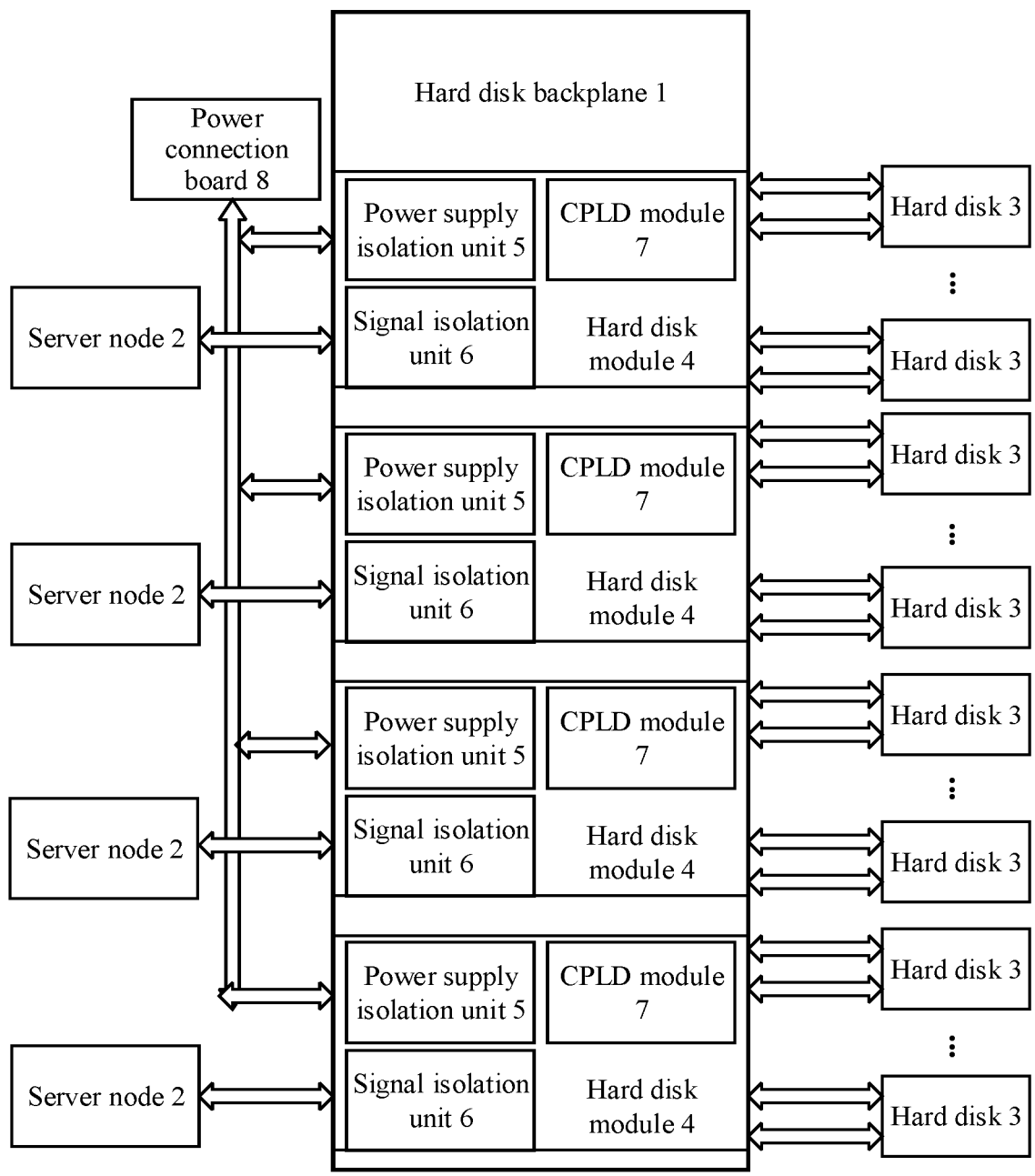
FIG. 1 is an overall schematic diagram of an architecture for improving reliability of a multi-server system.

An architecture for improving reliability of a multi-server system is provided according to the embodiment of the present disclosure. As shown in FIG. 1, the architecture includes: a hard disk backplane 1, at least two server nodes 2, a power connection board 8 and at least two hard disks 3.

The hard disk backplane 1 is provided with at least two hard disk modules 4, each of which includes a power supply isolation unit 5 and a signal isolation unit 6.

The power connection board 8 is connected to the power supply isolation unit 5 in each of the at least two hard disk modules 4, so that power supplies of the at least two hard disk modules 4 are isolated from each other.

Each of the at least two server nodes 2 is connected to at least one of the hard disks 3 through a corresponding signal isolation unit 6. The server node 2, the signal isolation unit 6 and the hard disk 3 which are connected to each other form an isolated data communication group. Signal isolation units in any two of isolated data communication groups belongs to different hard disk modules, so that any two of the isolated data communication groups are isolated from each other.

In the embodiment, the hard disk module 4 further includes: a CPLD module 7 of a complex programmable logic controller.

The CPLD module 7 is configured to edit and set hard disk jumpers, set a hard disk active state, monitor a hard disk failure, detect a hard disk working state and control working of a hard disk lamp. By providing the CPLD module 7 in each hard disk module 4, a failed hard disk management line controlled by a server node can be isolated from other modules, such that hard disk state detection and LED control of other modules are not affected, and the reliability of the hard disk backplane can be improved.

Figure 2:
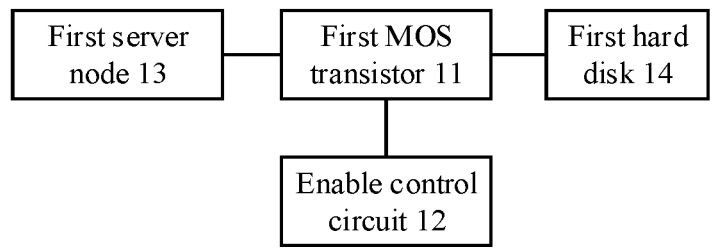
FIG. 2 is a schematic diagram of a signal isolation unit.

In the embodiment of the present disclosure, as shown in FIG. 2, the signal isolation unit 6 includes a first MOS transistor 11 and an enable control circuit 12. A first server node 13 is connected to a drain D the first MOS transistor 11, a first hard disk 14 is connected to a source S of the first MOS transistor 11, and the enable control circuit 12 is connected to a gate G of the first MOS transistor 11. A single-ended signal is inputted from the first server node 13 to the drain D of the first MOS transistor 11, a single-ended signal is outputted from the source S of the first MOS transistor 11 to the first hard disk 14. The first server node 13, the first hard disk 14 and the signal isolation unit 6 belong to a same isolated data communication group.

The signal isolation unit 6 includes a single-ended signal isolation line and an I2C signal isolation line. Single-ended signals such as the Present signal, the BMCReset signal, the fan PWM signal and the fan Tach signal of the hard disk backplane 1 are isolated by the first MOS transistor 11, and the gate G of the first MOS transistor 11 is controlled by the enable control circuit 12 to realized isolation and on/off of the signal.

The hard disk module 4 further includes a hot-plug assembly. The hot-plug assembly includes a hot-plug buffer and a hot-plug control IC. The hot-plug control IC is connected to the hot-plug buffer, and the hot-plug buffer is provided with an I2C signal input terminal and an I2C signal output terminal. The hot-plug control IC is configured to send an enable signal to make the hot-plug buffer work when the hot-plug control IC detects a Ready signal which indicates that a handshake between a hot-plug I2C signal of the hard disk module and an I2C signal of another card is finished. With the single-ended signal isolation line and the I2C signal isolation line, hot plug, isolation and protection of the backplane signal can be realized, such that a hard disk module with a failed signal line which is controlled by a server node can be isolated from other modules, the noise pulse generated during hot plug of the hard disk signal is suppressed, and the reliability of the hard disk backplane 1 is improved.

Figure 3:
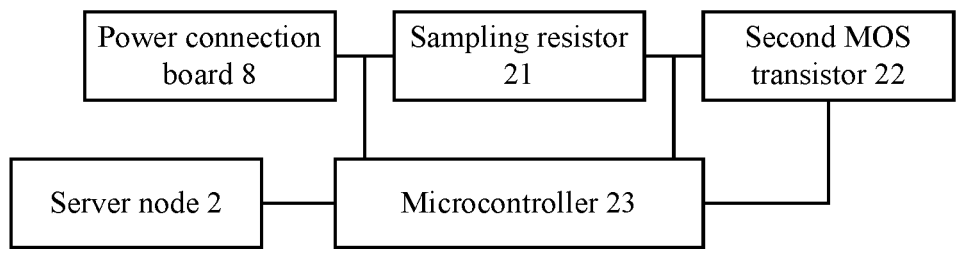
FIG. 3 is a schematic diagram of a power supply isolation unit.

In the embodiment as shown in FIG. 3, the power supply isolation unit 5 includes a sampling resistor 21, a second MOS transistor 22 and a microcontroller 23.

A first terminal of the sampling resistor 21 is connected to the power connection board 8, a second terminal of the sampling resistor 21 is connected to a drain D of the second MOS transistor 22, and a drain D a source S of the second MOS transistor is connected to an output terminal of the power supply isolation unit. The microcontroller 23 is connected to the server node 2, the sampling resistor 21 and a gate G of the second MOS transistor 22. The microcontroller is configured to obtain a power supply current through the sampling resistor, and control on/off of the second MOS transistor by being connected to the gate G of the second MOS transistor. If the power supply current is greater than a preset value, the microcontroller controls the second MOS transistor to be turned off. Alternatively, the microcontroller exchanges data with the server node, transmits the obtained power supply current to the server node, and controls on/off of the second MOS transistor according to a control instruction from the server node.

The hard disk modules respectively controlled by the server nodes have independent power supply systems. The independent power supply isolation unit 5 is provided in each hard disk module, for providing hot plug protection for the power supply by detecting the power supply current in a real-time manner. Further, as a separated power supply isolation unit 5, each server node can individually control the power-on and power-off of the corresponding hard disk module by controlling the gate G of the second MOS transistor.

Figure 4:
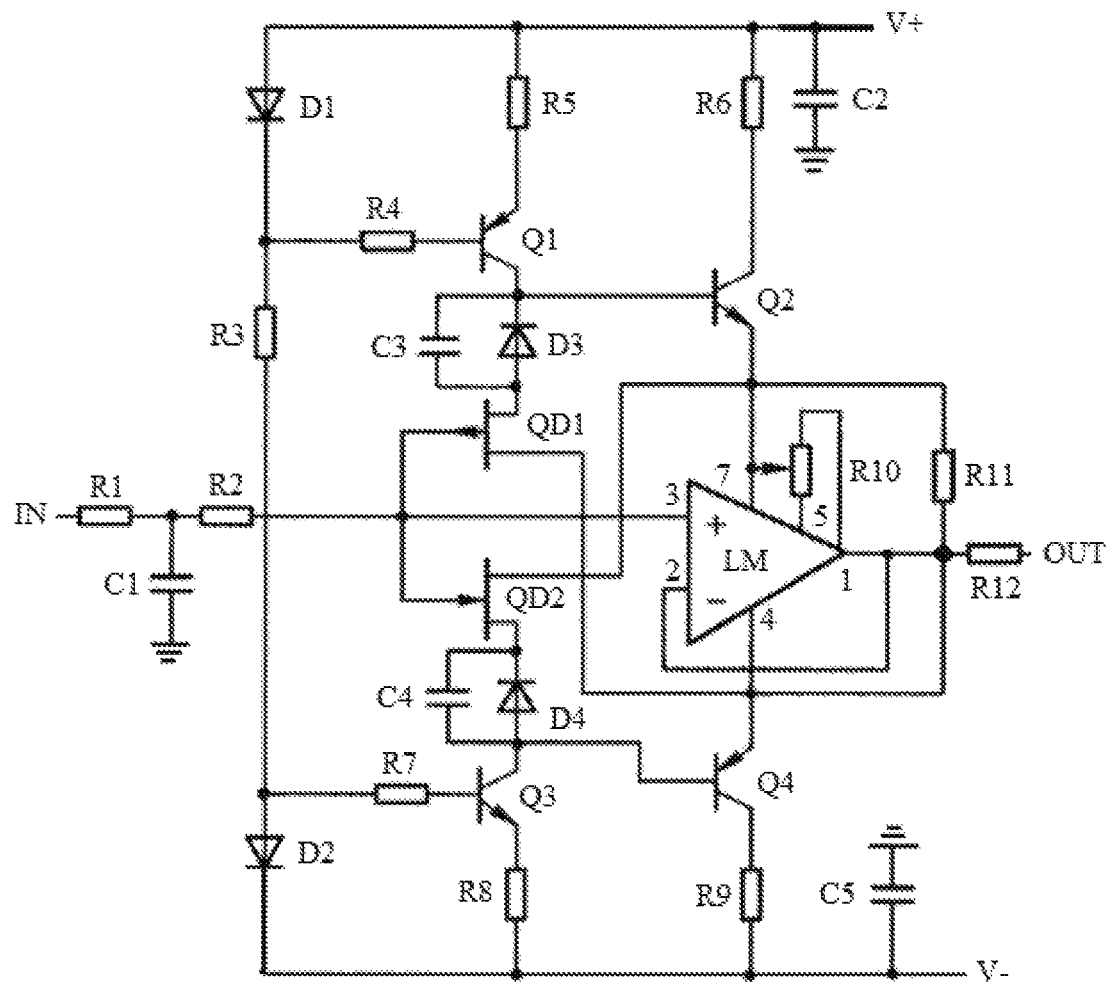
FIG. 4 is a circuit diagram of a power supply isolation unit.

Another implementation of the power supply isolation unit 5 is as shown in FIG. 4. The power supply isolation unit includes: a first resistor R1, a second resistor R2, a third resistor R3, a fourth resistor R4, a fifth resistor R5, a sixth resistor R6, a seventh resistor R7, an eighth resistor R8, a ninth resistor R9, a tenth resistor R10, an eleventh resistor R11, a twelfth resistor R12, a first capacitor C1, a second capacitor C2, a third capacitor C3, a fourth capacitor C4, a fifth capacitor C5, a first diode D1, a second diode D2, a third diode D3, a fourth diode D4, a first triode Q1, a second triode Q2, a third triode Q3, a fourth triode Q4, a first field effect transistor QD1, a second field effect transistor QD2, and an amplifier LM.

A first terminal of the first resistor R1 is connected to an input terminal of the power supply isolation unit, and the input terminal of the power supply isolation unit is connected to the power connection board.

A second terminal of the first resistor R1 is grounded through the first capacitor C1 and is connected to a first terminal of the second resistor R2. A second terminal of the second resistor R2 is connected to a gate G of the first field effect transistor QD1, a gate G of the second field effect transistor QD2, and a pin 3 of the amplifier LM. A positive pole of an external power supply is connected to an anode of the first diode D1, a first terminal of the fifth resistor R5 and a first terminal of the sixth resistor R6, and is grounded through the second capacitor C2. A cathode of the first diode D1 is connected to a base of the first triode Q1 through the fourth resistor R4 and is connected to a first terminal of the third resistor R3. A second terminal of the fifth resistor R5 is connected to an emitter of the first triode Q1. A second terminal of the sixth resistor R6 is connected to a collector of the second triode Q2. A second terminal of the third resistor R3 is connected to a first terminal of the seventh resistor R7 and an anode of the second diode D2. A second terminal of the seventh resistor R7 is connected to a base of the third triode Q3. A cathode of the second diode D2 is grounded through the fifth capacitor C5 and is connected to a second terminal of the eighth resistor R8, a second terminal of the resistor R9 and a negative pole of the external power supply. A first terminal of the eighth resistor R8 is connected to an emitter of the third triode Q3. A first terminal of the ninth resistor R9 is connected to a collector of the fourth triode Q4. A collector of the first triode Q1 is connected to a base of the second triode Q2, a first terminal of the third capacitor C3, a cathode of the third diode D3. A second terminal of the third capacitor C3 and an anode of the third diode D3 are connected to a drain D of the first field effect transistor QD1. A source S of the first field effect transistor QD1 is connected to a pin 1 and a pin 2 of the amplifier LM, is connected to an output terminal of the power supply isolation unit through the twelfth resistor R12, and is connected to a source S of the second field effect transistor QD2 through the eleventh resistor R11. The pin 1 of the amplifier LM is connected to a pin 5 of the amplifier LM through the tenth resistor R10. An emitter of the second triode Q2 is connected to the source S of the second field effect transistor QD2, the eleventh resistor R11, a pin 7 of the amplifier LM and a sliding terminal of the tenth resistor R10. A drain D of the second field effect transistor QD2 is connected to a first terminal of the fourth capacitor C4, a cathode of the fourth diode D4. A second terminal of the fourth capacitor C4, an anode of the fourth diode D4, a collector of the third triode Q3 and a base of the fourth triode Q4 are connected. An emitter of the fourth triode Q4 is connected to a pin 4 of the amplifier LM, the source S of the first field effect transistor QD1 and the eleventh resistor R11. With the power supply isolation unit 5, the risk of power failure of the entire system caused by short circuit of a hard disk module can be effectively avoided, and the reliability of system power supply can be improved.

With the above descriptions of the disclosed embodiments, the skilled in the art may practice or use the present disclosure. Various modifications to the embodiments are apparent for the skilled in the art. The general principle suggested herein can be implemented in other embodiments without departing from the spirit or scope of the disclosure. Therefore, the present disclosure should not be limited to the embodiments disclosed herein, but has the widest scope that is conformity with the principle and the novel features disclosed herein.

The invention claimed is:

1. An architecture for improving reliability of a multi-server system, comprising a hard disk backplane, at least two server nodes, a power connection board and at least two hard disks, wherein
   the hard disk backplane is provided with at least two hard disk modules, each of which comprises a power supply isolation unit and a signal isolation unit,
   the power connection board is connected to the power supply isolation unit in each of the at least two hard disk modules, so that power supplies of the at least two hard disk module are isolated from each other, and
   each of the at least two server nodes is connected to at least one of the hard disks through a corresponding signal isolation unit, the server node, the signal isolation unit and the hard disk which are connected to each other form an isolated data communication group, signal isolation units in any two of isolated data communication groups belong to different hard disk modules, so that any two of the isolated data communication groups are isolated from each other,
   wherein the power supply isolation unit comprises a first resistor R1, a second resistor R2, a third resistor R3, a fourth resistor R4, a fifth resistor R5, a sixth resistor R6, a seventh resistor R7, an eighth resistor R8, a ninth resistor R9, a tenth resistor R10, an eleventh resistor R11, a twelfth resistor R12, a first capacitor C1, a second capacitor C2, a third capacitor C3, a fourth capacitor C4, a fifth capacitor C5, a first diode D1, a second diode D2, a third diode D3, a fourth diode D4, a first triode Q1, a second triode Q2, a third triode Q3, a fourth triode Q4, a first field effect transistor QD1, a second field effect transistor QD2, and an amplifier LM,
   a first terminal of the first resistor R1 is connected to an input terminal of the power supply isolation unit, and the input terminal of the power supply isolation unit is connected to the power connection board,
   a second terminal of the first resistor R1 is grounded through the first capacitor C1 and is connected to a first terminal of the second resistor R2,
   a second terminal of the second resistor R2 is connected to a gate G of the first field effect transistor QD1, a gate G of the second field effect transistor QD2 and a pin 3 of the amplifier LM,
   a positive pole of an external power supply is connected to an anode of the first diode D1, a first terminal of the fifth resistor R5 and a first terminal of the sixth resistor R6, and is grounded through the second capacitor C2,
   a cathode of the first diode D1 is connected to a base of the first triode Q1 through the fourth resistor R4 and is connected to a first terminal of the third resistor R3,
   a second terminal of the fifth resistor R5 is connected to an emitter of the first triode Q1,
   a second terminal of the sixth resistor R6 is connected to a collector of the second triode Q2,
   a second terminal of the third resistor R3 is connected to a first terminal of the seventh resistor R7 and an anode of the second diode D2,
   a second terminal of the seventh resistor R7 is connected to a base of the third triode Q3,
   a cathode of the second diode D2 is grounded through the fifth capacitor C5 and is connected to a second terminal of the eighth resistor R8, a second terminal of the resistor R9 and a negative pole of the external power supply,
   a first terminal of the eighth resistor R8 is connected to an emitter of the third triode Q3,
   a first terminal of the ninth resistor R9 is connected to a collector of the fourth triode Q4,
   a collector of the first triode Q1 is connected to a base of the second triode Q2, a first terminal of the third capacitor C3 and a cathode of the third diode D3,
   a second terminal of the third capacitor C3 and an anode of the third diode D3 are connected to a drain D of the first field effect transistor QD1,
   a source S of the first field effect transistor QD1 is connected to a pin 1 and a pin 2 of the amplifier LM, is connected to an output terminal of the power supply isolation unit through the twelfth resistor R12, and is connected to a source S of the second field effect transistor QD2 through the eleventh resistor R11,
   the pin 1 of the amplifier LM is connected to a pin 5 of the amplifier LM through the tenth resistor R10,
   an emitter of the second triode Q2 is connected to the source S of the second field effect transistor QD2, the eleventh resistor R11, a pin 7 of the amplifier LM and a sliding terminal of the tenth resistor R10,
   a drain D of the second field effect transistor QD2 is connected to a first terminal of the fourth capacitor C4 and a cathode of the fourth diode D4,
   a second terminal of the fourth capacitor C4, an anode of the fourth diode D4, a collector of the third triode Q3 and a base of the fourth triode Q4 are connected, and
   an emitter of the fourth triode Q4 is connected to a pin 4 of the amplifier LM, the source S of the first field effect transistor QD1 and the eleventh resistor R11.

2. The architecture for improving reliability of a multi-server system according to claim 1, wherein each of the at least two hard disk modules further comprises a CPLD module of a complex programmable logic controller,
   the CPLD module is configured to edit and set hard disk jumpers, set a hard disk active state, monitor a hard disk failure, detect a hard disk working state and control working of a hard disk lamp.

3. The architecture for improving reliability of a multi-server system according to claim 1, wherein the signal isolation unit comprises a first MOS transistor and an enable control circuit,
   a first server node is connected to a drain D the first MOS transistor, a first hard disk is connected to a source S of the first MOS transistor, and the enable control circuit is connected to a gate G of the first MOS transistor, a single-ended signal is inputted from the first server node to the drain D of the first MOS transistor, and a single-ended signal is outputted from the source S of the first MOS transistor to the first hard disk, and the first server node, the first hard disk and the signal isolation unit belong to a same isolated data communication group.

4. The architecture for improving reliability of a multi-server system according to claim 1, wherein the hard disk module further comprises a hot-plug assembly, the hot-plug assembly comprises a hot-plug buffer and a hot-plug control IC, the hot-plug control IC is connected to the hot-plug buffer, and the hot-plug buffer is provided with an I2C signal input terminal and an I2C signal output terminal, and the hot-plug control IC is configured to send an Enable signal to make the hot-plug buffer work when the hot-plug control IC detects a Ready signal which indicates that a handshake between a hot-plug I2C signal of the hard disk module and an I2C signal of another card is finished.

5. The architecture for improving reliability of a multi-server system according to claim 1, wherein the power supply isolation unit comprises a sampling resistor, a second MOS transistor and a microcontroller, a first terminal of the sampling resistor is connected to the power connection board, a second terminal of the sampling resistor is connected to a drain D of the second MOS transistor, and a drain D a source S of the second MOS transistor is connected to an output terminal of the power supply isolation unit, the microcontroller is connected to the server node, the sampling resistor and a gate G of the second MOS transistor, and the microcontroller is configured to obtain a power supply current through the sampling resistor, and control on/off of the second MOS transistor by being connected to the gate G of the second MOS transistor, wherein the microcontroller controls the second MOS transistor to be turned off in a case that the power supply current is greater than a preset value, or the microcontroller exchanges data with the server node, transmits the obtained power supply current to the server node, and controls on/off of the second MOS transistor according to a control instruction of the server node.

* * * * *